United States Patent
Kimura et al.

[11] Patent Number: 5,748,659
[45] Date of Patent: May 5, 1998

[54] SEMICONDUCTOR LASER DEVICE

[75] Inventors: Tatsuya Kimura; Masayoshi Takemi, both of Tokyo, Japan

[73] Assignee: Mitsubishi Denki Kabushiki Kaisha, Tokyo, Japan

[21] Appl. No.: 557,827

[22] Filed: Nov. 14, 1995

[30] Foreign Application Priority Data

Nov. 22, 1994 [JP] Japan ................... 6-287683

[51] Int. Cl.$^6$ ................ H01S 3/19; H01L 21/302
[52] U.S. Cl. .................. 372/46; 438/31; 438/41; 438/47
[58] Field of Search ............... 372/44, 45, 46, 372/49; 257/96, 97; 438/31, 39, 41, 47

[56] References Cited

U.S. PATENT DOCUMENTS

| | | | |
|---|---|---|---|
| 5,345,464 | 9/1994 | Takemoto | 372/46 |
| 5,390,205 | 2/1995 | Mori et al. | 372/46 |
| 5,440,147 | 8/1995 | Kazmierski et al. | 257/13 |
| 5,459,747 | 10/1995 | Takiguchi et al. | 372/50 |

FOREIGN PATENT DOCUMENTS

| | | |
|---|---|---|
| 60-107881 | 6/1985 | Japan . |
| 2246180 | 10/1990 | Japan . |
| 407170013A | 7/1995 | Japan . |

*Primary Examiner*—Jerome Jackson
*Assistant Examiner*—John Guay
*Attorney, Agent, or Firm*—Leydig, Voit & Mayer, Ltd.

[57] ABSTRACT

A method of fabricating a semiconductor laser device includes growing a first conductivity type InGaAsP mass-transport suppressing layer, a first conductivity type InP second lower cladding layer, an InGaAsP active layer, and a second conductivity type InP upper cladding layer on the entire surface of a first conductivity type InP first lower cladding layer, forming a mesa structure serving as a waveguide by etching and removing a portion where a waveguide is to be formed, and forming current blocking layers which confine a current to the waveguide on the opposite sides of the mesa structure by MOCVD. Since the first conductivity type InP second lower cladding layer is sandwiched between the InGaAsP mass-transport suppressing layer and the InGaAsP active layer, mass-transport of In atoms on the opposite sides of the second lower cladding layer is suppressed when the temperature rises before the growth of the current blocking layers. The deformation of opposite sides of the second lower cladding layer is prevented. Therefore, the leakage path width is controlled to a range where the light output power is a maximum, whereby a semiconductor laser device having improved maximum light output power is obtained.

8 Claims, 6 Drawing Sheets

5,748,659

SEMICONDUCTOR LASER DEVICE

FIELD OF THE INVENTION

The present invention relates to a semiconductor laser device and a method of fabricating the semiconductor laser device and, more particularly, to an InP series semiconductor laser device and a method of fabricating the InP series semiconductor laser device.

BACKGROUND OF THE INVENTION

A description is given of a prior art method of fabricating an InP series semiconductor laser device including a waveguide which has a double-heterostructure and current blocking layers burying opposite sides of the waveguide. FIGS. 5(a)–5(f) are sectional views illustrating a prior art method of fabricating an InP series semiconductor laser device. In the step of FIG. 5(a), a p type InP lower cladding layer 2 having a dopant concentration of $1\times10^{18}$cm$^{-3}$ and a thickness of 2.0 µm, an undoped InGaAsP active layer 3 having a thickness of 0.1 µm, an n type InP upper cladding layer 4 having a dopant concentration of $1\times10^{18}$cm$^{-3}$ and a thickness of 0.5 µm, an n type InGaAs cap layer 5 having a dopant concentration of $1\times10^{18}$cm$^{-3}$ and a thickness of 0.1 µm are successively grown on a p type InP substrate 1 by metal organic chemical vapor deposition (hereinafter, referred to as MOCVD) at a growth temperature of 650° C. After an SiO$_2$ film having a thickness of 100 nm is disposed on the entire surface of the cap layer 5 by sputtering, a resist is formed on a region where a waveguide is to be formed on the SiO$_2$ film and, employing the resist as a mask, the SiO$_2$ film is etched. In addition, by removing the resist, an SiO$_2$ stripe 6 having a width of 1.5 µm is formed as shown in FIG. 5(b). In the step of FIG. 5(c), employing the SiO$_2$ stripe 6 as a mask, the semiconductor layers disposed on the substrate 1 are etched to a depth of 1.5 µm by reactive ion etching (hereinafter, referred to as RIE) to form a mesa structure serving as a waveguide. When the semiconductor layers serving as the current blocking layers are selectively grown on the opposite sides of the mesa structure by MOCVD, the substrate temperature is raised to the growth temperature of 650° C. before beginning of the growth, so that mass-transport of In occurs on the opposite sides of the p type lower cladding layer and the configuration of the side surfaces of the mesa structure is deformed as shown in FIG. 5(d). This result is due to some of P atoms on the surface of the InP layer being dissociated from InP upon rising of the temperature. The remaining In atoms are transported on the surface of the InP layer, and then In and P are recrystallized. This transport is called mass-transport. Mass-transport of In atoms is improved with an increase in the temperature. Thereafter, p type InP first current blocking layers 7 having a dopant concentration of $1\times10^{18}$cm$^{-3}$ and a thickness of 0.2 µm, n type InP second current blocking layers 8 having a dopant concentration of $7\times10^{18}$cm$^{-3}$ and a thickness of 0.6 µm, and p type InP third current blocking layers 9 having a dopant concentration of $1\times10^{18}$cm$^{-3}$ and a thickness of 0.7 µm are successively grown by MOCVD at the growth temperature of 650° C. so as to bury the opposite sides of the mesa structure, as shown in FIG. 5(e). In the step of FIG. 5(f), after the SiO$_2$ stripe 6 and the InGaAs cap layer 5 are etched and removed, an n type InP contact layer 10 having a dopant concentration of $7\times10^{18}$cm$^{-3}$ and a thickness of 1 µm is formed on the p type InP third current blocking layers 9 and the n type InP upper cladding layer 4 by MOCVD at a growth temperature of 650° C. Further, an n side electrode is formed on the n type InP contact layer 10 and a p side electrode is formed on the rear surface of the p type InP substrate 1, thereby completing a semiconductor laser device.

In the above-described semiconductor laser device, electrons and holes are injected into the active layer by applying a forward voltage, and they recombine to produce a the laser oscillation. As shown in FIG. 6, current flowing in the semiconductor laser device is divided into a current B flowing into the active layer and contributing to the laser oscillation and leakage current C flowing not into the active layer but into the p type InP first current blocking layer. In FIG. 6, junction interfaces between the semiconductor layers having the same conductivity type are indicated by broken lines. Of course, the leakage current C does not contribute to the laser oscillation. The leakage current C depends on the thickness A of the p type InP current blocking layer on the side of the active layer shown in FIG. 5(e), where the thickness A is called a leakage path width. FIG. 7 shows a relation between a ratio of the leakage currents to the total currents (hereinafter, referred to as leakage current ratio) and leakage path width dependency for the maximum light output power of the laser. When the leakage path width is widened, the leakage current ratio is increased and the maximum light output power is decreased. Although it is a matter of course that proportion of the current flowing into the active layer is decreased with an increase in the leakage current ratio, with an increase in the leakage path width, the maximum light output power is decreased considerably, exceeding the increase of the leakage current ratio, i.e., the decrease of the current flowing into the active layer as shown in FIG. 7. This result is due to a decrease of the maximum light output power caused by not only the decrease of the current flowing into the active layer but also by an increase in the heat generation with an increase in the leakage current.

As described above, the maximum light output power is decreased with an increase in the leakage path width, whereby it is necessary to make the leakage path width narrow for improving the maximum light output power. On the other hand, when the leak path width, i.e., the thickness of the p type InP first current blocking layer on the side surface of the waveguide, is narrower than 0.1 µm, current flows between the n type InP upper cladding layer and the n type InP second current blocking layer, and a new leakage current flowing from the p type InP lower cladding layer to the n type InP upper cladding layer through the n type InP second current blocking layer is generated, thereby decreasing the maximum light output power. Therefore, in order to maximize the maximum light output power, the leakage path width should be controlled to 0.1–0.2 µm.

According to the prior art method of fabricating the semiconductor laser device, by mass-transport of In atoms before the growth of the current blocking layers, the opposite sides of the mesa structure serving as the waveguide, especially the opposite sides of the lower cladding layer, are deformed so that various crystal planes appear with no reproducibility. When the current blocking layers are grown on the opposite sides of the mesa structure, the growth rates are different dependent on the surface orientation of the crystal plane appearing on the opposite sides of the mesa structure. Therefore, it is difficult to precisely control the thickness of the first current blocking layers grown on the opposite sides of the deformed lower cladding layer. The growth of the first current blocking layers on the opposite sides of the lower cladding layer has an influence on the growth of the first current blocking layers on the opposite sides of the active layer disposed on the lower cladding layer, and it is difficult to precisely control the leakage path width.

As described above, the opposite exposed side surfaces of the InP lower cladding layer are deformed by mass-transport of In atoms when the temperature rises to about 650° C. The inventors have experimentally found that mass-transport of In atoms is very difficult to generate on the opposite sides of the InP cladding layer sandwiched between semiconductor layers including Ga or As as InGaAsP or InGaAs.

SUMMARY OF THE INVENTION

It is an object of the present invention to provide a method of fabricating a semiconductor laser device precisely controlling the leakage path width and having high maximum light output power.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor laser device comprises growing a mass-transport suppressing layer comprising first conductivity type InGaAsP, a second lower cladding layer comprising first conductivity type InP, an active layer comprising an InGaAsP layer, and an upper cladding layer comprising second conductivity type InP opposed to first conductivity type on the entire surface of a first lower cladding layer comprising first conductivity type InP, and forming a waveguide layer comprising the first lower cladding layer, the mass-transport suppressing layer, the second lower cladding layer, the active layer, and the upper cladding layer, etching portions of the waveguide layer on both sides of a portion where a waveguide is to be formed from the side of the upper cladding layer, stopping the etching when the etching of the mass-transport suppressing layer is completed or when the thin layer part on the surface of the first lower cladding layer is etched, and forming a waveguide guiding the generated laser beam, and growing semiconductor layers on the opposite sides of the waveguide where the waveguide layer is etched away and forming current blocking layers which confine a current into the waveguide. Since the first conductivity type InP second lower cladding layer is sandwiched between the InGaAsP mass-transport suppressing layer and the InGaAsP active layer, mass-transport of In atoms on the opposite sides of the second lower cladding layer is suppressed when the temperature rises before the growth of the current blocking layers and the deformation of the opposite sides of the second lower cladding layer is prevented. That is, on the opposite sides of the second lower cladding layer when the growth of the current blocking layers, a crystal plane, i.e., (110) plane, which appears just after the etching for forming the waveguide is maintained as it is. Therefore, the thickness of the semiconductor layers grown on the opposite sides of the second lower cladding layer and the adjacent active layer is controlled at a high precision and the leak path width is controlled in a range where the maximum light output power is the localized maximum, whereby a semiconductor laser device having improved maximum light output power is obtained.

According to a second aspect of the present invention, in the fabricating method of the semiconductor laser device, the process of forming the waveguide layer includes forming a cap layer comprising InGaAs or InGaAsP on the entire surface of the waveguide layer, and the process of forming the waveguide includes etching the cap layer on the portions of the waveguide layer on both sides of a portion where a waveguide is to be formed, etching the portions of the waveguide layer on both sides of a portion where a waveguide is to be formed from the side of the upper cladding layer, and stopping the etching when the etching of the mass-transport suppressing layer is completed or when the thin layer part on the surface of the first lower cladding layer is etched. Since the second conductivity type InP upper cladding layer is sandwiched between the cap layer comprising InGaAs or InGaAsP and the InGaAsP active layer, as in the first conductivity type InP second lower cladding layer, mass-transport of In atoms on the opposite sides of the upper cladding layer is suppressed when the temperature rises before the growth of the current blocking layers. That is, the deformation of the opposite sides of the upper and lower cladding layers sandwiching the active layer is prevented as well as the leak path width is more precisely controlled than the above-described fabricating method, whereby a semiconductor laser device having improved maximum light output power is obtained.

According to a third aspect of the present invention, in the fabricating method of the semiconductor laser device, a band gap energy of InGaAsP constituting the mass-transport suppressing layer is larger than a maximum band gap energy which is possible to absorb the laser beam radiated from the active layer. Therefore, the leak path width is precisely controlled and a semiconductor laser device improving the maximum light output power is obtained as well as the laser beam radiated from the active layer is not absorbed into the mass-transport suppressing layer, whereby a semiconductor laser device having a high emission efficiency is obtained.

According to a fourth aspect of the present invention, in the fabricating method of the semiconductor laser device, the process of forming the current blocking layers includes growing the semiconductor layers by MOCVD at the growth temperature of 450°–600° C. Since the growth temperature of the current blocking layers is lower than the usual growth temperature of 650° C., mass-transport of In atoms on the opposite sides of the InP cladding layer is suppressed and the deformation of the opposite sides of the InP cladding layer is prevented. Therefore, the leak path width is precisely controlled and a semiconductor laser device having improved maximum light output power is obtained.

According to a fifth aspect of the present invention, in the fabricating method of the semiconductor laser device, the process of forming the current blocking layers includes growing low temperature growing layers in the semiconductor layers on the opposite sides of the waveguide and on the surface of the first lower cladding layer by MOCVD at the growth temperature of 450°–600° C. and then growing layers other than the low temperature growing layers in the semiconductor layers by MOCVD at higher temperature than the growth temperature of the low temperature growing layer. Since the growth temperature of the low temperature growing layers is lower than the usual growth temperature of 650° C., mass-transport of In atoms on the opposite sides of the InP cladding layer is suppressed and the deformation of the opposite sides of the InP cladding layer is prevented. Therefore, the leak path width is precisely controlled and a semiconductor laser device having improved maximum light output power is obtained. In addition, since the current blocking layers other than the lower temperature growing layers are grown at higher temperature than the growth temperature of the low temperature growing layers, a stable growth is possible with high controllability.

According to a sixth aspect of the present invention, in the fabricating method of the semiconductor laser device, the process of forming the current blocking layers includes starting on the growth of the semiconductor layers by MOCVD at the growth temperature of 450°~600° C. and rising the growth temperature as the growth advances. Since the temperature at a beginning of the growth of the current blocking layers is lower than the usual growth temperature of 650° C., mass-transport of In atoms on the opposite sides of the InP cladding layer is suppressed and the deformation of the opposite sides of the InP cladding layer is prevented. Therefore, the leak path width is precisely controlled and a semiconductor laser device having improved maximum light output power is obtained. In addition, since the growth temperature becomes higher than the temperature at a beginning of the growth as the growth advances, a stable growth is possible with high controllability.

According to a seventh aspect of the present invention, a semiconductor laser device comprises a waveguide successively laminating the first conductivity type InP first lower cladding layer, the first conductivity type InGaAsP mass-transport suppressing layer, the first conductivity type InP second lower cladding layer, the InGaAsP active layer, and the second conductivity type InP upper cladding layer and guiding the generated laser beam, and current blocking layers confining a current into the waveguide layer and formed on the opposite sides of the waveguide. Since the first conductivity type InP second lower cladding layer is sandwiched between the InGaAsP mass-transport suppressing layer and the InGaAsP active layer, mass-transport of In atoms on the opposite sides of the second lower cladding layer is suppressed when the temperature rises before the growth of the current blocking layers and the deformation of the opposite sides of the InP cladding layer is prevented. That is, on the opposite sides of the second lower cladding layer in the growth of the current blocking layers, a crystal plane appearing just after the etching for forming the waveguide is maintained as it is. Therefore, the thickness of the semiconductor layers grown on the opposite sides of the second lower cladding layer and the adjacent active layer is controlled at a high precision and the leak path width is controlled in a range where the maximum light output power is the localized maximum, whereby a semiconductor laser device having improved maximum light output power is obtained.

According to an eighth aspect of the present invention, in the semiconductor laser device, a band gap energy of InGaAsP constituting the mass-transport suppressing layer is larger than a maximum band gap energy which is possible to absorb the laser beam radiated from the active layer. Therefore, the leak path width is precisely controlled and the maximum light output power is improved as well as the laser beam radiated from the active layer is not absorbed into the mass-transport suppressing layer, thereby improving the emission efficiency.

DETAILED DESCRIPTION OF THE PREFERRED EMBODIMENTS

Embodiment 1

Figure 1:
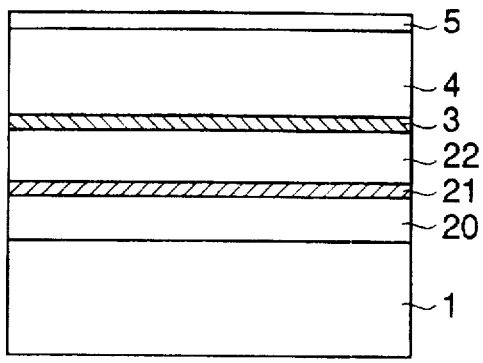
FIGS. 1(a)–1(d) are sectional views illustrating a method of fabricating a semiconductor laser device according to a first embodiment of the present invention.
Figure 1:
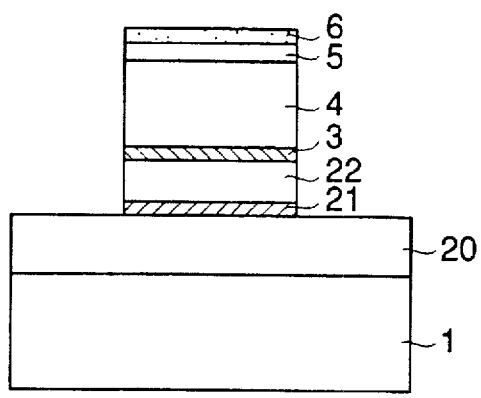
Figure 1:
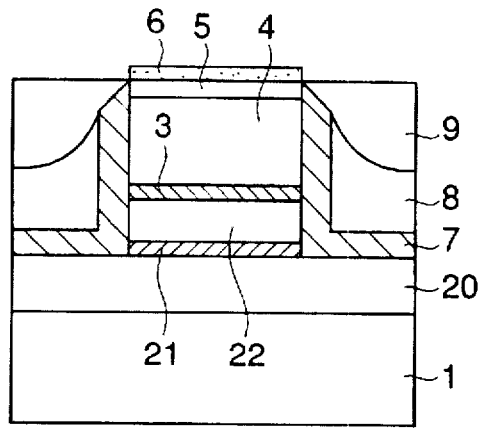
Figure 1:
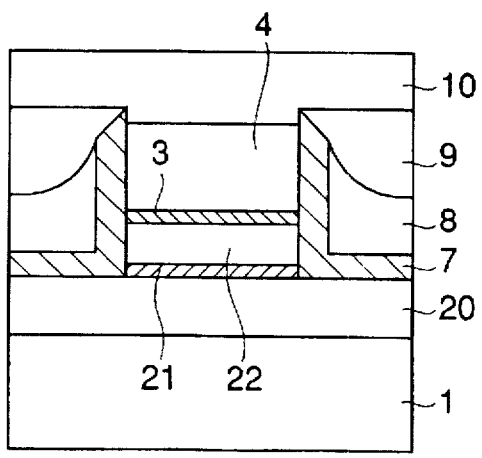
Figure 2:
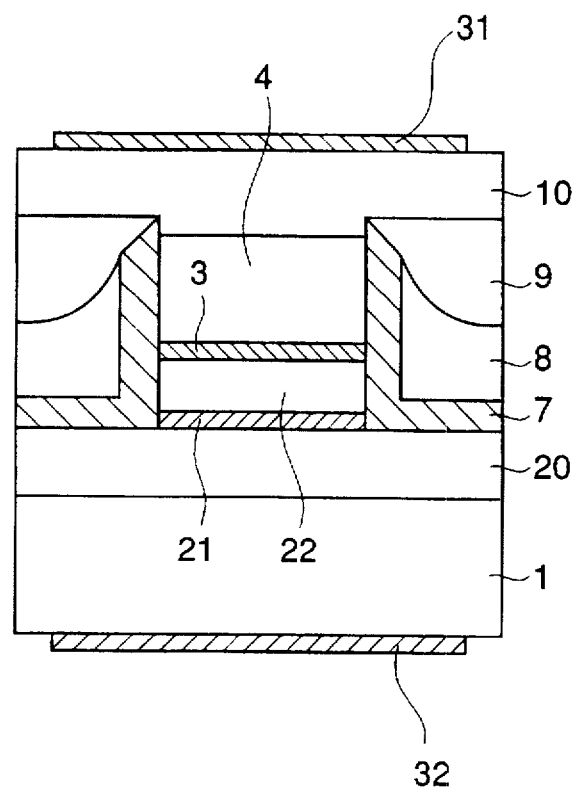
FIG. 2 is a sectional view illustrating a semiconductor laser device according to a first embodiment of the present invention.

FIGS. 1(a)–1(d) are sectional views illustrating a method of fabricating a semiconductor laser device according to a first embodiment of the present invention. In the step of FIG. 1(a), a p type InP first lower cladding layer 20 having a dopant concentration of $1\times10^{18} cm^{-3}$ and a thickness of 1.0 µm, a p type $In_{0.76}Ga_{0.24}As_{0.55}P_{0.45}$ mass-transport suppressing layer 21 having a dopant concentration of $1\times10^{18} cm^{-3}$ and a thickness of 0.1 µm, a p type InP second lower cladding layer 22 having a dopant concentration of $1\times10^{18} cm^{-3}$ and a thickness of 1.0 µm, an undoped $In_{0.65}Ga_{0.35}As_{0.79}P_{0.21}$ active layer 3 having a thickness of 0.1 µm, an n type InP upper cladding layer 4 having a dopant concentration of $1\times10^{18} cm^{-3}$ and a thickness of 0.5 µm, and an n type InGaAs cap layer 5 having a dopant concentration of $1\times10^{18} cm^{-3}$ and a thickness of 0.1 µm are successively grown on a surface of a p type InP substrate 1 which is a (001) plane of the InP crystal by MOCVD at a growth temperature of 650° C. After an $SiO_2$ film having a thickness of 100 nm is disposed on the entire surface of the cap layer 5 by sputtering, a resist is formed on a region where a waveguide is to be formed on the $SiO_2$ film and, employing the resist as a mask, the $SiO_2$ film is etched. In addition, by removing the resist, an $SiO_2$ stripe 6 having a width of 1.5 µm is formed. In the step of FIG. 1(b), employing the $SiO_2$ stripe 6 as a mask, semiconductor layers disposed on the substrate 1 are etched by RIE to form a mesa structure serving as a waveguide. When the p type InGaAsP mass-transport suppressing layer 21 is etched and removed and the surface of the p type InP first lower cladding layer 20 is exposed, this etching stops. Even if the surface of the p type InP first lower cladding layer 20 is etched, etching of 0.1 µm depth from the surface of the layer 20 produces no problem. Thereafter, p type InP first current blocking layers 7 having a dopant concentration of $1\times10^{18} cm^{-3}$ and a thickness of 0.2 µm, n type InP second current blocking layers 8 having a dopant concentration of $7\times10^{18} cm^{-3}$ and a thickness of 0.6 µm, and p type InP third current blocking layers 9 having a dopant concentration of $1\times10^{18} cm^{-3}$ and a thickness of 0.7 µm are successively grown by MOCVD at the growth temperature of 650° C. so as to bury the opposite sides of the mesa structure, as shown in FIG. 1(c). In the step of FIG. 1(d), after the $SiO_2$ stripe 6 and the InGaAs cap layer 5 are etched and removed, an n type InP contact layer 10 having a dopant concentration of $7\times10^{18} cm^{-3}$ and a thickness of 1.0 µm is formed on the p type InP third current blocking layers 9 and the n type InP upper cladding layer 4 by MOCVD at the growth temperature of 650° C. Then, the rear surface of the p type InP substrate 1 is ground to make the thickness of the substrate 1 about 100 µm. Further, a Cr/Au film 200 nm thick is formed on the n type InP contact layer 10 as an n side electrode 31 and an AuZn film 200 µm thick is formed on the rear surface of the p type InP substrate 1 as a p side electrode 32, thereby completing the semiconductor laser device shown in FIG. 2.

In the first embodiment, since the p type InP second lower cladding layer 22 is sandwiched between the InGaAsP mass-transport suppressing layer 21 and the InGaAsP active layer 3, and the n type InP upper cladding layer 4 is also sandwiched between the InGaAs cap layer 5 and the InGaAsP active layer 3, even if the growth temperature rises to 650° C. before the growth of the current blocking layers, mass-transport of In atoms at the side surfaces of the second lower cladding layer and the upper cladding layer is suppressed and the deformation of the side surfaces of these layers is prevented. That is, at the side surfaces of these layers during the growth of the blocking layers, a crystal plane ((110) plane) which appears just after the etching for forming the mesa structure as the waveguide is maintained as it is. Therefore, the thickness of the first current blocking layers on the opposite side surfaces of the active layer sandwiched between the second lower cladding layer and the upper cladding layer is precisely controlled and the leakage path width is controlled in a range of 0.1~0.2 μm whereby the maximum light output power is the localized maximum, and a semiconductor laser device having improved maximum light output power is obtained.

Since the wavelength of the light radiated from the $In_{0.65}Ga_{0.35}As_{0.79}P_{0.21}$ active layer 3 is 1.55 μm, but the wavelength of the light corresponding to the energy band gap of the $In_{0.76}Ga_{0.24}As_{0.55}P_{0.45}$ mass-transport suppressing layer 21 is 1.30 μm, the light radiated from the active layer is not absorbed in the mass-transport suppressing layer 21. Therefore, a semiconductor laser device with a high emission efficiency is obtained. In addition, in the semiconductor laser including the mass-transport suppressing layer, the energy band gap is larger than the energy band gap corresponding to the wavelength of the light radiated from the active layer, so the laser beam is not absorbed.

A position for forming the p type InGaAsP mass-transport suppressing layer 21, i.e., a thickness of the p type InP second lower cladding layer 22, is determined in accordance with a desired height of the mesa.

Mass-transport of In atoms is promoted with an increase in temperature. While the growth temperature is 650° C. during the growth of the current blocking layers, by lowering the growth temperature to 500° C., mass-transport of In atoms at the side surfaces of the InP cladding layer is suppressed and deformation of the side surfaces is prevented. Further, the leakage path width is precisely controlled and a semiconductor laser device improving the maximum light output power is obtained. When the growth temperature is lowered to 500° C., however, it is difficult to stably control several growth conditions, except for the temperature, for example, gas flow, gas composition ratio, and pressure. These difficulties are improved by the method of a second embodiment.

Embodiment 2

Figure 3:
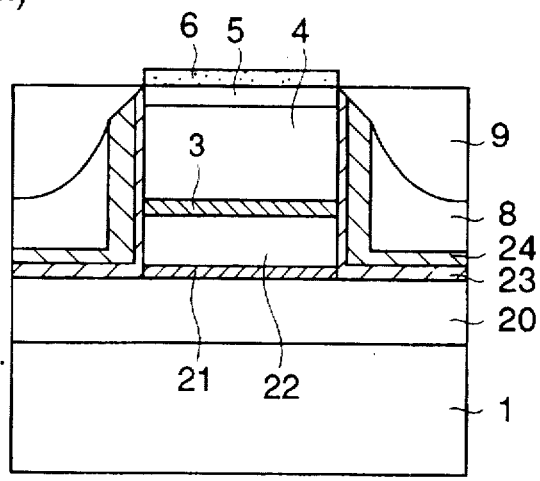
FIGS. 3(a) and 3(b) are sectional views illustrating a method of fabricating a semiconductor laser device according to a second embodiment of the present invention.
Figure 3:
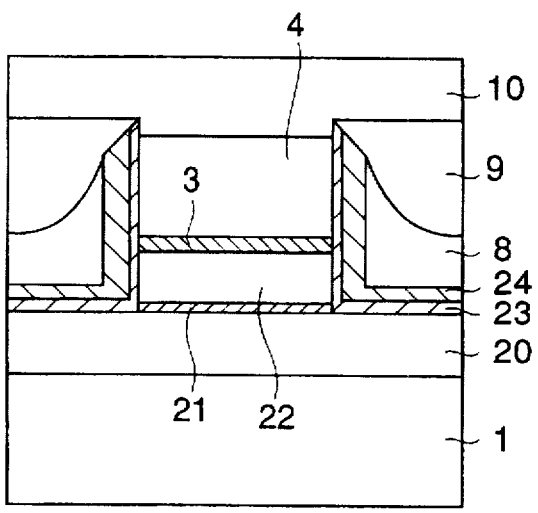

FIGS. 3(a) and 3(b) are sectional views illustrating a method of fabricating a semiconductor laser device according to a second embodiment of the present invention. Initially, process steps shown in FIGS. 1(a) and 1(b) are performed, and then current blocking layers are selectively grown on the opposite sides of the waveguide by MOCVD as shown in FIG. 3(a). The first p type InP first current blocking layers 23 grown at a lower temperature and having a dopant concentration of $1\times10^{18}cm^{-3}$ and a thickness of 50 μm (hereinafter, referred to as low temperature p type InP first current blocking layers) are grown at a growth temperature of 500° C. and then p type InP first current blocking layers 24 grown at a higher temperature and having a dopant concentration of $1\times10^{18}cm^{-3}$ and a thickness of 0.15 μm (hereinafter referred to as high temperature p type InP first current blocking layer), n type InP second current blocking layers 8 having a dopant concentration of $7\times10^{18}cm^{-3}$ and a thickness of 0.6 μm, and p type InP third current blocking layers 9 having a dopant concentration of $1\times10^{18}cm^{-3}$ and a thickness of 0.7 μm are successively grown by raising the growth temperature to 650° C. In the step of FIG. 3(b), after the $SiO_2$ stripe 6 and the n type InGaAs cap layer 5 are etched and removed, an n type InP contact layer 10 having a dopant concentration of $7\times10^{18}cm^{-3}$ and a thickness of 1.0 μm is grown on the n type InP upper cladding layer 4 and the p type InP third current blocking layers 9. After the rear surface of the p type InP substrate is ground to make the thickness 100 μm, an n side electrode and a p side electrode are respectively formed, thereby completing a semiconductor laser device.

According to the second embodiment, since the p type InP mass-transport suppressing layer 21 is provided, and the low temperature p type InP first current blocking layers 23 as the first grown layer during the growth of the current blocking layers, are grown at a temperature of 500° C. lower than the general growth temperature of 650° C. of the first embodiment, mass-transport of In atoms at the side surfaces of the cladding layer is further suppressed relative to the first embodiment. Deformation of the side surfaces of the cladding layer is surely prevented. Therefore, the thickness of the first current blocking layers grown on the opposite sides of the active layer which is sandwiched between the second lower cladding layer and the upper cladding layer is more precisely controlled and the leakage path width is controlled in a range of 0.1~0.2 μm whereby the maximum light output power is the localized maximum, and a semiconductor laser device having improved maximum light output power is obtained. In addition, since the current blocking layers, except for the low temperature current blocking layers, are grown at the general temperature of 650° C, it is possible to stably grow the current blocking layers with a high controllability.

Even if the growth temperature of the first current blocking layers is not gradually changed as described above, the first current blocking layers are grown by successively raising the temperature of 500° C. at the beginning of the growth to 650° C., and all second and third current blocking layers are grown at the growth temperature of 650° C., so that mass-transport of In atoms can be suppressed and the second and third current blocking layers are stably grown with high controllability.

Embodiment 3

Figure 4:
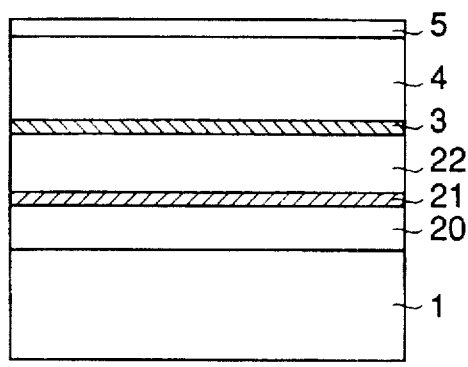
FIGS. 4(a)–4(d) are sectional views illustrating a method of fabricating a semiconductor laser device according to a third embodiment of the present invention.
Figure 4:
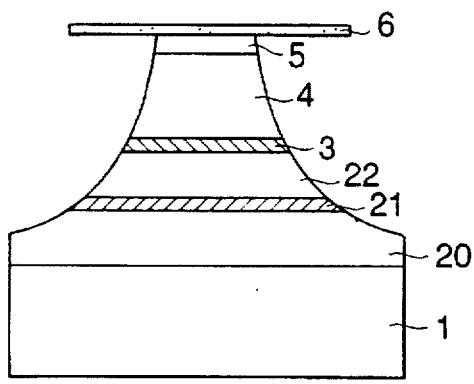
Figure 4:
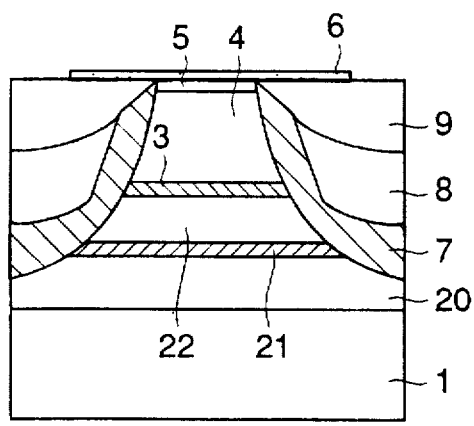
Figure 4:
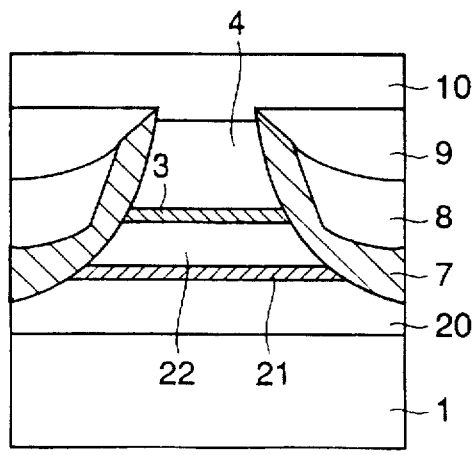
Figure 5:
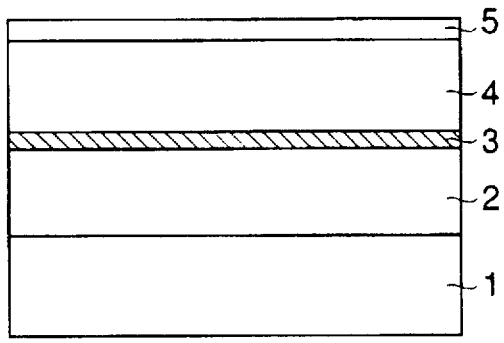
FIGS. 5(a)–5(f) are sectional views illustrating a method of fabricating a prior art semiconductor laser device.
Figure 5:
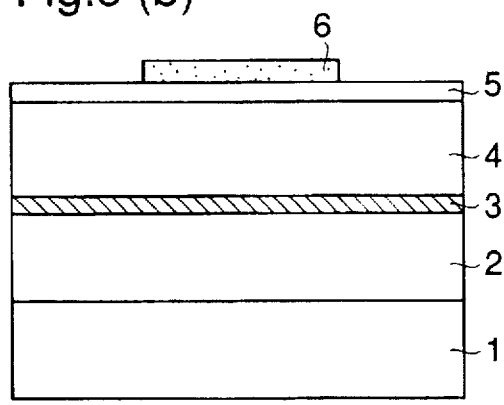
Figure 5:
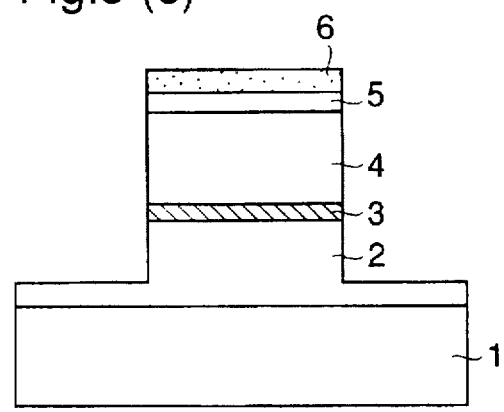
Figure 5:
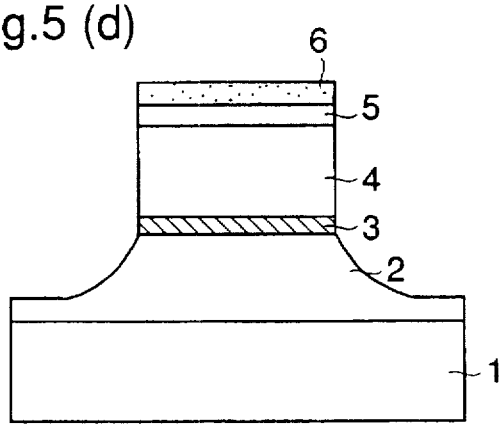
Figure 5:
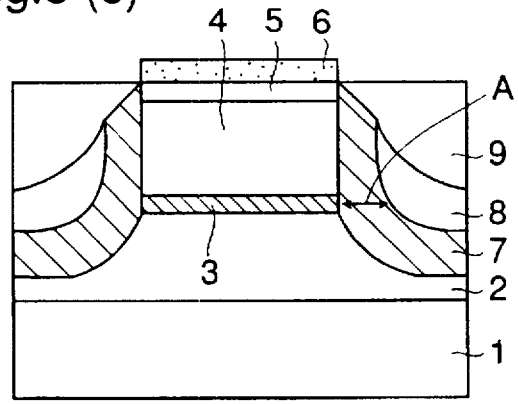
Figure 5:
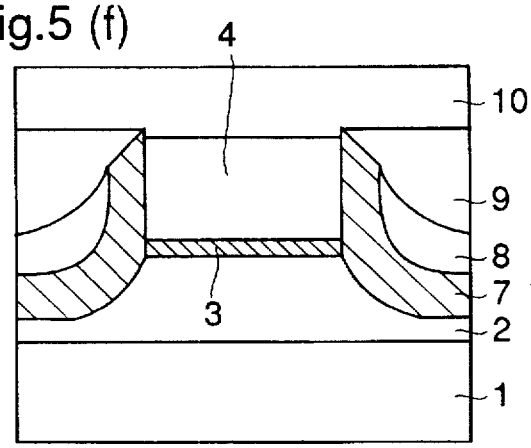
Figure 6:
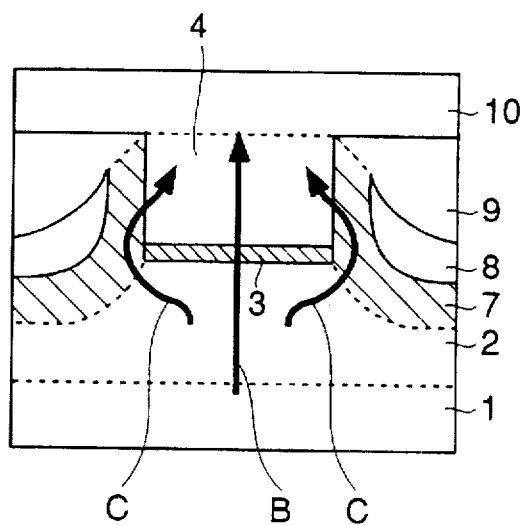
FIG. 6 is a sectional view illustrating current paths of the semiconductor laser device.
Figure 7:
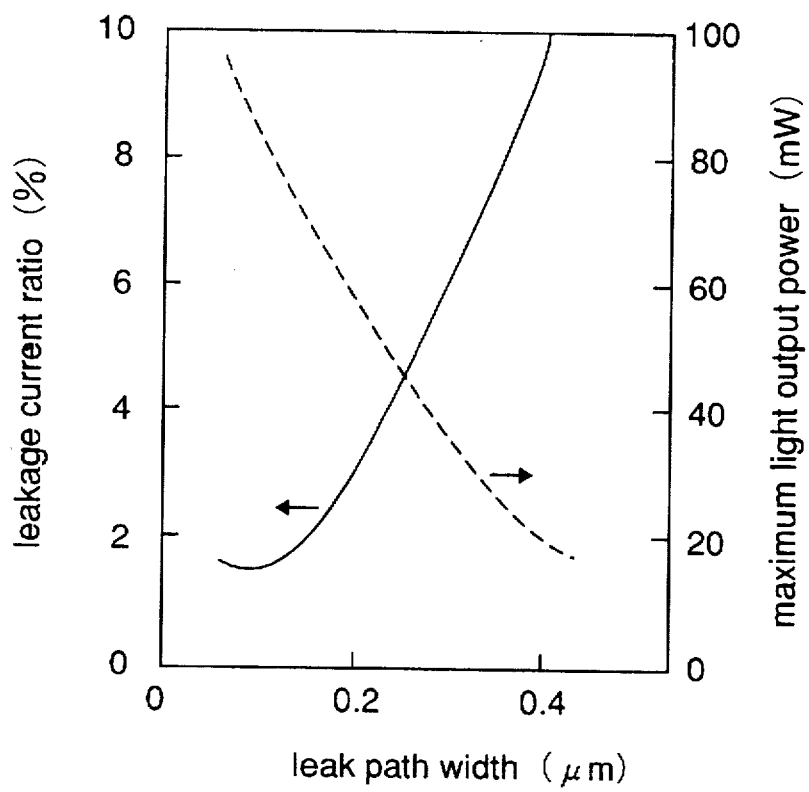
FIG. 7 is a diagram showing a relation between leakage current ratio and leakage path width dependency for maximum light output power.

FIGS. 4(a)-4(d) are sectional views illustrating a method of fabricating a semiconductor laser device according to a third embodiment of the present invention. In the third embodiment, etching for forming the waveguide is not RIE but wet etching. In the step of FIG. 4(a), on the p type InP substrate 1, a p type InP first lower cladding layer 20 having a dopant concentration of $1\times10^{18}cm^{-3}$ and a thickness of 1.0 μm, a p type $In_{0.76}Ga_{0.24}As_{0.55}P_{0.45}$ mass-transport suppressing layer 21 having a dopant concentration of $1\times10^{18}cm^{-3}$ and a thickness of 0.1 μm, a p type InP second lower cladding layer 22 having a dopant concentration of $1\times10^{18}cm^{-3}$ and a thickness of 1.0 μm, an undoped $In_{0.65}Ga_{0.35}As_{0.79}P_{0.21}$ active layer 3 having a thickness of 0.1 μm, an n type InP upper cladding layer 4 having a dopant concentration of $1\times10^{18}cm^{-3}$ and a thickness of 0.5 μm, and an n type InGaAs cap layer 5 having a dopant concentration of $1\times10^{18}cm^{-3}$ and a thickness of 0.1 μm are successively grown by MOCVD at a growth temperature of 650° C. After an $SiO_2$ film having a thickness of 100 nm is disposed on the entire surface of the cap layer 5 by sputtering, a resist is formed at a region where a waveguide is to be formed on the SiO$_2$ film and, employing the resist as a mask, the SiO$_2$ film is etched. In addition, by removing the resist, an SiO$_2$ stripe 6 having a width of 5.5 μm is formed. In the step of FIG. 4(b), employing the SiO$_2$ stripe 6 as a mask, semiconductor layers disposed on the substrate 1 are etched by wet etching to form a mesa structure serving as a waveguide. This wet etching is performed to a depth of 2.3 μm so as to completely etch and remove the p type InGaAsP mass-transport suppressing layer 21 and to expose the surface of the p type InP first lower cladding layer 20. Etching of the surface of the p type InP first lower cladding layer 20 is not a problem. Since the wet etching proceeds not only in an etching depth direction perpendicular to the p type InP substrate 1 but also a direction horizontal to the substrate 1, in the mesa structure serving as the waveguide, the width of the upper part is narrower than the width of the lower part and narrower than the width of the SiO$_2$ stripe. Therefore, the width of the SiO$_2$ stripe must be wider than the width of the waveguide which is to be formed, considering the etching in the horizontal direction. Thereafter, p type InP first current blocking layers 7 having a dopant concentration of $1\times10^{18}$cm$^{-3}$ and a thickness of 0.5 μm, n type InP second current blocking layers 8 having a dopant concentration of $7\times10^{18}$cm$^{-3}$ and a thickness of 0.8 μm, and p type InP third current blocking layers 9 having a dopant concentration of $1\times10^{18}$cm$^{-3}$ and a thickness of 1 μm are successively grown by MOCVD at the growth temperature of 650° C. so as to bury the opposite sides of the mesa structure, as shown in FIG. 4(c). In the step of FIG. 4(d), after the SiO$_2$ stripe 6 and the InGaAs cap layer 5 are etched and removed, an n type InP contact layer 10 having a dopant concentration of $7\times10^{18}$cm$^{-3}$ and a thickness of 1 μm is formed on the p type InP third current blocking layers 9 and the n type InP upper cladding layer 4 by MOCVD at the growth temperature of 650° C. Then, the rear surface of the p type InP substrate 1 is ground to make the thickness of the substrate 1 about 100 μm. Further, an n side electrode is formed on the n type InP contact layer 10 and a p side electrode is formed on the rear surface of the p type InP substrate 1, thereby completing a semiconductor laser device.

Since the InGaAsP mass-transport suppressing layer 21 and the InGaAs cap layer 5 are formed even in a case where wet etching is employed for forming the mesa structure serving as the waveguide, as where RIE is employed in the first embodiment, mass-transport of In atoms on the opposite sides of the second lower cladding layer and the upper cladding layer is suppressed and deformation of the opposite side surfaces is prevented. That is, on the opposite sides of the second lower cladding layer and the upper cladding layer in the growth of the current blocking layers, the crystal plane which appears just after the etching for forming the mesa structure is maintained as it is. Therefore, the thickness of the first current blocking layers which are grown on the opposite sides of the active layer sandwiched between the second lower cladding layer and the upper cladding layer is controlled at high precision and the leakage path width is usually controlled in a range of 0.1–0.2 μm, whereby the maximum light output power is the localized maximum, and a semiconductor laser device having improved maximum light output power is obtained.

As in the first embodiment, since the wavelength of the laser beam radiated from the In$_{0.65}$Ga$_{0.35}$As$_{0.79}$P$_{0.21}$ active layer is 1.55 μm, but, the wavelength of the laser beam corresponding to the band gap energy of In$_{0.76}$Ga$_{0.24}$As$_{0.55}$P$_{0.45}$ constituting the mass-transport suppressing layer is 1.30 μm, the laser beam radiated from the active layer is not absorbed in the mass-transport suppressing layer, thereby realizing a semiconductor laser device having a high emission efficiency.

What is claimed is:

1. A method of fabricating a semiconductor laser device comprising:

preparing a first lower cladding layer comprising first conductivity type InP;

growing a mass-transport suppressing layer comprising first conductivity type InGaAsP, a second lower cladding layer comprising first conductivity type InP, an active layer comprising an InGaAsP layer, and an upper cladding layer comprising second conductivity type InP on the first lower cladding layer, forming a waveguide layer comprising the first lower cladding layer, the mass-transport suppressing layer, the second lower cladding layer, the active layer, and the upper cladding layer;

etching portions of the waveguide layer on both sides, stopping the etching when etching through the mass-transport suppressing layer is completed or when the first lower cladding layer is first etched, forming a waveguide guiding a laser beam; and growing semiconductor layers on the opposite sides of the waveguide where the waveguide layer and forming current blocking layers which confine a current to the waveguide.

2. The method of claim 1 further including:

forming the waveguide layer by forming a cap layer comprising InGaAs or InGaAsP on the waveguide layer; and forming the waveguide by etching the cap layer on both sides, and etching the waveguide layer.

3. The method of claim 1 wherein the mass-transport suppressing layer has a band gap energy larger than the energy of a laser beam radiated from the active layer.

4. The method of claim 1 further including forming the current blocking layers by MOCVD at a growth temperature of 450°–600° C.

5. The method of claim 1 further including forming the current blocking layers by growing the semiconductor layers on the opposite sides of the waveguide and on the surface of the first lower cladding layer by MOCVD at a growth temperature of 450°–600° C. and then growing other semiconductor layers by MOCVD at higher temperature.

6. The method of claim 1 further including forming the current blocking layers by starting on growth of the semiconductor layers by MOCVD at a growth temperature of 450°–600° C. and raising the growth temperature as the growth advances.

7. A semiconductor laser device comprising:

a waveguide including, successively, a first conductivity type InP first lower cladding layer, a first conductivity type InGaAsP mass-transport suppressing layer, a first conductivity type InP second lower cladding layer, an InGaAsP active layer, and a second conductivity type InP upper cladding layer for guiding a laser beam; and current blocking layers confining current to the waveguide on opposite sides of the waveguide.

8. The semiconductor laser device of claim 7 wherein the InGaAsP mass-transport suppressing layer has a band gap energy larger than the energy of a laser beam radiated from the active layer.

* * * * *